United States Patent
Banerji et al.

[11] Patent Number: 5,311,059
[45] Date of Patent: May 10, 1994

[54] BACKPLANE GROUNDING FOR FLIP-CHIP INTEGRATED CIRCUIT

[75] Inventors: Kingshuk Banerji; Fadia Nounou, both of Plantation; William B. Mullen, III, Boca Raton, all of Fla.

[73] Assignee: Motorola, Inc., Schaumburg, Ill.

[21] Appl. No.: 825,367

[22] Filed: Jan. 24, 1992

[51] Int. Cl.⁵ ............................................. H01L 23/28
[52] U.S. Cl. .................................. 257/778; 257/691; 257/697; 257/659; 361/748; 361/772
[58] Field of Search ............... 257/659, 691, 697, 778; 361/397, 404, 407

[56] References Cited

U.S. PATENT DOCUMENTS

| | | | |
|---|---|---|---|
| 3,585,455 | 6/1971 | Naylor | 361/407 |
| 3,614,546 | 10/1971 | Avins | 257/659 |
| 3,811,183 | 5/1974 | Celling | 257/778 |
| 4,801,999 | 1/1989 | Hayward et al. | 257/691 |
| 4,820,013 | 4/1989 | Fuse | 257/778 |
| 4,843,036 | 6/1989 | Schmidt et al. | 437/224 |
| 4,996,629 | 2/1991 | Christiansen et al. | 361/404 |
| 4,999,699 | 3/1991 | Christie et al. | 357/65 |
| 5,121,190 | 6/1992 | Hsiao et al. | 257/778 |

Primary Examiner—Rolf Hille
Assistant Examiner—David Ostrowski
Attorney, Agent, or Firm—Dale W. Dorinski

[57] ABSTRACT

A semiconductor device package comprises a substrate (20) having a metallization pattern (22) on at least one surface, and a semiconductor device (10) having an active surface (12) and a grounded surface (14) on opposed sides. The semiconductor device is electrically attached to the substrate metallization pattern with the active surface (12) facing the substrate. A polymeric underfill material (30) substantially fills the space between the semiconductor device and the substrate. An electrically conductive material (35) covers the exposed grounded surface (14) of the semiconductor device and at least a portion of the metallization pattern (22), providing electrical connection between the grounded surface of the semiconductor and the metallization pattern (22) on the substrate.

16 Claims, 1 Drawing Sheet

BACKPLANE GROUNDING FOR FLIP-CHIP INTEGRATED CIRCUIT

TECHNICAL FIELD

This invention relates generally to a semiconductor device package, and more specifically to a flip chip semiconductor device.

BACKGROUND

Silicon integrated circuit chips are typically packaged in sealed enclosures, such as chip carriers or dual in-line packages (DIP), and interconnected with other components on printed circuit boards. The integrated circuit is typically connected to a carrier substrate with the active or upper surface of the integrated circuit facing away from the carrier substrate. Interconnections between the IC and the substrate is typically made by thin metal wires or wirebonds welded between the pads of the IC and the circuitry on the printed circuit board.

In an alternate packaging configuration known as flip chip, the integrated circuit is bonded directly to the substrate by means of solder bumps or other metal interconnects and is mounted with the active surface facing the printed circuit board. This type of interconnection eliminates the expense, unreliability, and low productivity of manual or automated wirebonding. It also allows the use of interior or array contacts as opposed to the limitation of using peripheral contacts with wirebonding methodology. The flip chip or control-collapse-chip-connection (C4) utilizes solder bumps deposited on wettable metal terminals of the chip and a matching footprint of solder wettable terminals on the substrate. The upside down flip chip is aligned to the substrate, and all interconnections are made simultaneously by reflowing the solder. This is opposite to the traditional method of bonding where the active side of the chip is facing up and is wirebonded to the substrate.

When chips are mounted in the conventional manner, that is, wirebonded, a ground connection to the backside ground plane of the chip can be made by forming a conductive connection between the backside ground plane of the chip and the ground of the printed circuit board. This is easily performed by means of conductive epoxy or solder, for example. In flip-chip devices the connection of the ground plane of the IC to the ground of the substrate is more difficult because now the ground plane is facing away from the substrate. Wirebonds may be formed between the ground of the IC and the ground of the substrate but this negates the advantages realized by the flip-chip mounting scheme.

A method of achieving a ground connection between the back side ground of the flip chip and the ground of the circuitry is needed that eliminates the cumbersome, costly and unreliable wirebonds.

SUMMARY OF THE INVENTION

Briefly, according to the invention, there is provided a semiconductor device package comprising a substrate having a metallization pattern on at least one surface, and a semiconductor device having an active surface and a grounded surface on opposed sides. The semiconductor device is electrically attached to the substrate metallization pattern with the active surface facing the substrate. A polymeric underfill material substantially fills the space between the semiconductor device and the substrate. An electrically conductive material covers the exposed grounded surface of the semiconductor device and at least a portion of the metallization pattern, providing electrical connection between the grounded surface of the semiconductor and the metallization pattern on the substrate.

In another embodiment, the semiconductor device package is a pad grid array chip carrier. The chip carrier comprises a printed circuit substrate having a metallization pattern on at least one surface and a flip chip. The flip chip has an active surface on one side and a grounded surface on a second opposed side. The flip chip is electrically attached to the metallization pattern with the active surface facing the printed circuit substrate. An underfill material substantially fills the space between the flip chip and the substrate metallization pattern, and a metal coating electrically connects the grounded surface of the flip chip to at least a portion of the metallization pattern.

DETAILED DESCRIPTION OF THE PREFERRED EMBODIMENT

Figure 1:
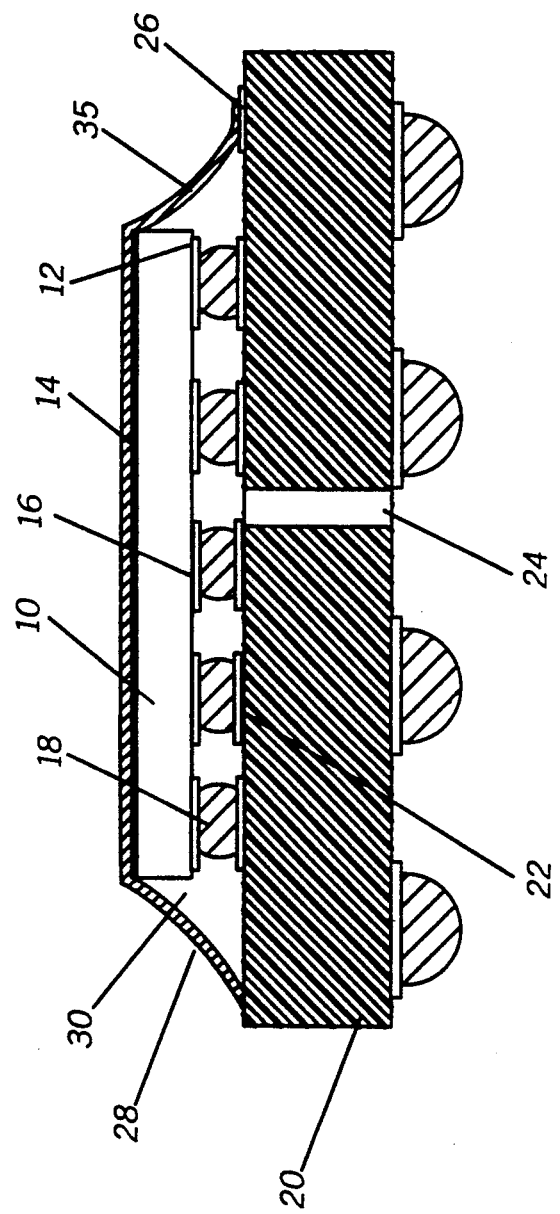
FIG. 1 is a cross-sectional view of a flip chip mounted to a substrate with the back plane ground connection in accordance with the present invention.

Referring to FIG. 1, which is intentionally not to scale in order to clearly show certain features, an integrated circuit 10 has an active surface 12 on one side and a ground plane 14 on an opposite side. The active surface 12 consists of all the conventional circuitry found on an integrated circuit, for example, transistors, resistors, arrays, input/output pads, and passivation. The ground plane 14 is typically a continuous metal surface but may also have a pattern. The input/output pads 16 on the active surface 12 of the integrated circuit or flip chip 10 are metallized by attaching solder bumps 18 to the pads. The metallization of the pads may also be accomplished with other types of metallization, such as bonding a gold ball or plating or depositing other metals.

A carrier substrate 20 has a metallization pattern or conductor pattern 22 corresponding to the input/output pads and solder bumps 18 of the flip chip integrated circuit. In addition, the substrate 20 also has a ground connection 26 which may consist of a ground plane, a single runner, or a number of runners. The substrate may be a rigid or flexible printed circuit board material such as FR-4, reinforced polyimide, reinforced polyester, fluoropolymers, CEM, paper-phenolic, KAPTON ®, or it may be a ceramic material. In the preferred embodiment, the substrate 20 is a printed circuit board material and has a size approximately the same or slightly larger than the integrated circuit, so as to form a chip carrier. The chip carrier is typically leadless and may be a perimeter type carrier or a pad grid array chip carrier with a plurality of solderable connections arranged in an array on the underside of the carrier substrate. Alternatively, pins may also be provided on the substrate. In an alternate embodiment, the carrier substrate 20 may be a much larger size and also contain other components, such as resistors, capacitors, switches, typically found on a printed circuit board.

The integrated circuit 10 is connected to the substrate 20 with the active surface 12 facing the metallization pattern 22. Interconnection between the IC 10 and the substrate 20 is made by means of the solder bumps 18 which are aligned with the pads 22 of the substrate and reflowed.

After connection of the integrated circuit 10 to the substrate 20, the flip-chip assembly is underfilled with a sealing material 30. A liquid polymer, typically an epoxy, urethane, or an acrylic, is applied to the gap formed between the flip chip and the substrate. The sealing material 30 is applied around the perimeter of the IC 10 or can, alternatively, be applied from the backside of the substrate through a hole 24 in the substrate. An example of an underfill material may be found in U.S. Pat. No. 4,999,699. The underfill polymer material 30 serves to environmentally protect the active surface 12 of the flip-chip IC and also to aid in mechanical attachment of the flip chip to the substrate. The underfill material 30 fills the void between the flip chip and the substrate and also extends a certain distance beyond the perimeter of the flip chip. Surface tension and wetting factors cause a concave fillet 28 to be formed around the perimeter of the flip chip. The liquid polymer material 30 is then cured by an appropriate means such as placing it in an oven to thermal cure, or by room temperature curing in the case of a two-product material, or by ultraviolet light, by radiation curing, or by radio-frequency energy.

In order to connect the back plane ground 14 of the flip chip 10 to the ground 26 of the substrate 20, a continuous film or coating of a conductive material is applied over the flip chip and the substrate. The coating of conductive material 35 is applied and covers the flip-chip IC, the concave fillets of the underfill material, portions of the substrate 20, and the ground connection 26 of the substrate. In this way connection is made between the substrate ground 26 and the back plane ground 14 of the IC. The conductive coating 35 may take several forms, depending upon the desired package. For example, if a pad array chip carrier is being fabricated, the conductive coating 35 may be a sputtered metal film such as copper, aluminum, titanium, chrome, or nickel. The sputtered film 35 may be additionally plated up by means of electroless or electroplated metals, such as copper, to give it higher conductivity and greater physical resistance to abrasion. If the flip-chip IC 10 is part of a larger assembly, such as a circuit board or mother board having additional components, the electrically conductive coating 35 may be formed by means of a conductive epoxy that is screen printed over the IC or dispensed on the IC and the substrate. Examples of conductive polymers are metal-filled epoxies or urethanes filled with copper, nickel, silver, gold, steel, stainless steel, or other metals.

In applying the underfill material 30 between the flip chip 10 and the substrate 20, it is very important that the underfill material not be allowed to extend beyond the flip chip so far that it covers the ground connection 26 on the substrate. A convenient way of preventing this is to apply a damming material in the area of the ground pin in order to prevent the spread of underfill material The use of a damming material or a barrier wall when escapsulating an integrated circuit is disclosed in U.S. Pat. No. 4,843,036, which patent is incorporated herein by reference. The same techniques are used when applying an underfill material. In addition, the ground 26 may also be covered with a temporary masking, such as a photoresist or a latex mask, in order to prevent the underfill material 30 from covering the ground. The underfill material may be later removed by mechanical abrasion, by chemical etching, or removal with a laser beam. In any event, the ground connection 26 on the substrate 10 must be uncontaminated and available to be connected to the back plane ground 14 by the conductive material 35.

In this way, a simple and robust connection is easily and economically made between the back plane ground of a flip-chip IC and the ground of the substrate. This connection eliminates the need for wirebonding and it provides a package that also protects the active surface and the integrated circuit from environmental damage. These examples are presented by way of explanation and not by way of limitation and the invention herein is not intended to be limited except as by the appended claims.

What is claimed is:

1. A semiconductor device package, comprising:
   a substrate having a metallization pattern on at least a first surface;
   a semiconductor device having an active surface on a first side and a grounded surface on a second opposed side, said semiconductor device electrically attached to the substrate metallization pattern with the active surface facing the substrate first surface;
   a polymeric underfill material substantially filling a space between the semiconductor device and the substrate metallization pattern; and
   an electrically conductive material coating the grounded surface of the semiconductor device with at least a portion of the metallization pattern, and providing electrical connection between the grounded surface and said portion of the metallization pattern.

2. The semiconductor device package as described in claim 1, wherein the electrically conductive material covers portions of the polymeric underfill material, and portions of the substrate.

3. The semiconductor device package as described in claim 1, wherein the electrically conductive material is metal.

4. The semiconductor device package as described in claim 3, wherein the electrically conductive material is a sputtered metal film.

5. The semiconductor device package as described in claim 1, wherein the electrically conductive material is a conductive polymer.

6. The semiconductor device package as described in claim 1, wherein the substrate is a printed circuit board material selected from the group consisting of FR-4, polyimide, CEM, paper-phenolic, or fluoropolymer.

7. The semiconductor device package as described in claim 1, wherein the substrate is ceramic.

8. The semiconductor device package as described in claim 1, wherein the substrate is a flexible film.

9. A pad grid array chip carrier, comprising:
   a printed circuit substrate having a metallization pattern on at least a first surface;
   a flip chip having an active surface on a first side and a grounded surface on a second opposed side, said flip chip electrically attached to said metallization pattern with said active surface facing said printed circuit substrate first surface;
   an underfill material substantially filling a space between the flip chip and the substrate metallization pattern; and
   a metal coating electrically connecting the grounded surface of the flip chip with at least a portion of the metallization pattern.

10. The pad grid array chip carrier as described in claim 9, wherein the metal coating also covers portions of the underfill material, and portions of the printed circuit substrate.

11. The pad grid array chip carrier as described in claim 9, wherein the metal coating is a sputtered metal film.

12. The pad grid array chip carrier as described in claim 9, wherein the metal coating is a conductive polymer.

13. The pad grid array chip carrier as described in claim 9, wherein the substrate is a printed circuit board material selected from the group consisting of FR-4, polyimide, CEM, paper-phenolic, or fluoropolymer.

14. The pad grid array chip carrier as described in claim 9, wherein the substrate is ceramic.

15. The pad grid array chip carrier as described in claim 9, wherein the substrate is a flexible film.

16. The pad grid array chip carrier as described in claim 9, wherein the substrate is substantially the same size as the flip chip and forms a chip carrier.

* * * * *